United States Patent [19]
Entrikin

[11] Patent Number: 5,677,646
[45] Date of Patent: Oct. 14, 1997

[54] DIFFERENTIAL PAIR AMPLIFIER WITH IMPROVED LINEARITY IN LOW-VOLTAGE APPLICATIONS

[75] Inventor: David W. Entrikin, Portland, Oreg.

[73] Assignee: Maxim Integrated Products, Inc., Sunnyvale, Calif.

[21] Appl. No.: 579,566

[22] Filed: Dec. 27, 1995

[51] Int. Cl.$^6$ ............................. H03F 1/32; H03F 3/45
[52] U.S. Cl. ..................... 330/149; 330/252; 330/295
[58] Field of Search ............................. 330/69, 149, 151, 330/252, 295

[56] References Cited

U.S. PATENT DOCUMENTS

| | | | |
|---|---|---|---|
| 3,460,051 | 8/1969 | Bray | 330/149 X |
| 3,633,120 | 1/1972 | Battjeb | 330/295 X |
| 4,132,958 | 1/1979 | Addis et al. | 330/149 X |
| 5,399,988 | 3/1995 | Knierim | 330/149 |

Primary Examiner—James B. Mullins
Attorney, Agent, or Firm—Hickman Beyer & Weaver, LLP

[57] ABSTRACT

A linear differential amplifier with improved voltage swing is disclosed. The linear differential amplifier corrects for an error voltage inherent in differential pair amplifiers, without hindering the available voltage swing, and thus, is particularly suited for low-voltage applications. The differential amplifier includes an input differential amplifier for receiving an input voltage difference to be amplified; a distortion correction differential amplifier for producing an error correction amount; and an output differential amplifier for receiving the input voltage difference and the error correction amount, amplifying the input voltage difference to produce an output voltage, and correcting the output voltage in accordance with the error correction amount. Also disclosed is a method for improving available voltage swing of a differential amplifier when amplifying an input voltage difference.

14 Claims, 4 Drawing Sheets

1

DIFFERENTIAL PAIR AMPLIFIER WITH IMPROVED LINEARITY IN LOW-VOLTAGE APPLICATIONS

BACKGROUND OF THE INVENTION

1. Field of the Invention

The present invention relates to differential pair amplifiers, and more particularly, to differential pair amplifiers having error correction.

2. Description of the Related Art

Differential amplifiers are commonly known and used in monolithic integrated circuits (ICs). Differential amplifiers are also known as differential pair amplifiers because the circuitry is symmetrical. In other words, differential pair amplifiers have an inverting side and a non-inverting side, both of which are similarly constructed.

FIG. 1 illustrates a schematic diagram of a conventional differential amplifier 2. The differential amplifier 2 has a pair of amplifying transistors 4 and 6. The bases of the amplifying transistors 4 and 6 receive a differential input voltage ($V_{IN}$), the collectors of the amplifying transistors 4 and 6 connect to a supply source 8 ($V_{CC}$) via resistors 10 and 12 ($R_C$), respectively, and the emitters of the amplifying transistors 4 and 6 are commonly connected to a second supply source 14 ($V_{EE}$) via a resistor 16 ($R_E$). The output voltage ($V_{OUT}$) of the differential amplifier 2 is obtained across the collectors of the amplifying transistors 4 and 6. For more details on basic differential amplifiers, see e.g., Malvino, *Electronic Principles*, McGraw-Hill, Inc., 1973.

More recently, a cascomp amplifier has been used in situations where greater linearity is needed. FIG. 2 illustrates a schematic diagram of a representative cascomp amplifier 18. Here, for improved linearity, a differential correction amplifier provides a correction signal to a main differential amplifier.

The cascomp amplifier 18 includes a main differential amplifier consisting of amplifying transistors 20 and 22, current sources 24 and 26, and an emitter resistor 28 ($R_E$). The emitters of the amplifying transistors 20 and 22 are coupled together through the emitter resistor ($R_E$), and the bases of the amplifying transistors 20 and 22 receive a differential input voltage ($V_{IN}$). Source resistors 30 and 32 ($R_S$) represent the resistance associated with a voltage source supplying the differential input voltage ($V_{IN}$). The current sources 24 and 26 provide the bias current to the amplifying transistors 20 and 22, respectively. Transistors 34 and 36 form a common base amplifier stage which, in conjunction with transistors 20 and 22, form a cascode output stage. The bases of the transistors 34 and 36 are driven by a supply voltage ($V_{BB}$). The collectors of the transistors 34 and 36 respectively connect to supply source ($V_{CC}$) through resistors 37 ($R_C$). The output voltage ($V_{OUT}$) of the cascomp amplifier 18 is available across the collectors of the transistors 34 and 36.

The voltage difference across the emitters of the transistors 34 and 36 provides an approximation of the error voltage found in the base emitter voltage of the amplifying transistors 20 and 22. The error voltage is caused by exponential relationship of a transistor's collector current to its base-emitter voltage. In other words, as the base-emitter voltage increases linearly, the collector current increases exponentially. In the cascomp amplifier 18, increasing the differential input voltage ($V_{IN}$) causes more current to flow in the amplifying transistor 20 and less current to flow in the amplifying transistor 22. To attain these currents, the base emitter voltage of the amplifying transistor 20 must increase, while the base emitter voltage of the amplifying transistor 22 must decrease. The resulting difference between the two base emitter voltages is an error voltage in that the voltage which appears across $R_E$ is not $V_{IN}$, but $V_{IN}$ minus the error voltage. If the error voltage were linearly related to $V_{IN}$, it would not affect the amplifier's output linearity. However, the error voltage is not linearly related to $V_{IN}$ because of the exponential relationship of the collector current to the base emitter voltage of a transistor. The difference in base emitter voltages of the main differential amplifier (amplifying transistors 20 and 22) is quantified as the product of the thermal voltage ($V_T$) and the natural logarithm (ln) of the ratio of the two collector currents, as shown in the following formula (1):

$$V_{error} = \Delta V_{BE} = (V_{BE20} - V_{BE22}) = V_T \ln(I_{C20}/I_{C22}), \tag{1}$$

where $V_T = kT/q$, with k being the Boltzmann constant, T being temperature (Kelvin) and q being electronic charge magnitude.

The approximated error voltage is supplied to a differential correction amplifier. The differential correction amplifier includes a pair of amplifying transistors 38 and 40. The bases of the amplifying transistors 38 and 40 are respectively connected to the collectors of the amplifying transistors 20 and 22, the emitters of the amplifying transistors 38 and 40 are respectively connected to current sources 42 and 44, and the collectors of the amplifying transistors 38 and 40 are respectively connected to the collectors of the transistors 36 and 34. The collector current of the amplifying transistors 38 and 40 of the differential correction amplifier is proportional to the error voltage associated with the main differential amplifier. Accordingly, the error current generated by the amplifying transistors 38 and 40 is added to the differential collector current of the transistors 34 and 36 so that a linear current is produced. The resulting linear current passes through the resistor B7 ($R_C$), thereby producing the output voltage ($V_{OUT}$) which is also linear. For more details on the representative cascomp amplifier 18 shown in FIG. 2, see e.g., U.S. Pat. Nos. 4,779,057 and 4,146,844.

The above-described conventional cascomp amplifier is designed to provide an approximately linear output voltage by correcting for the error voltage. However, in low voltage applications, such as battery powered circuits, the conventional cascomp amplifier has insufficient voltage swing available for the amplified output voltage. As a result, the output voltage is distorted because of the lack of available voltage swing. Hence, in low voltage applications, the conventional attempts to correct for non-linearities are largely unsatisfactory and in many cases leads to more non-linearities or distortion rather than less.

Thus, there is a need for a differential amplifier design that is suitable for removing non-linear signal distortion, particularly in low-voltage situations.

SUMMARY OF THE INVENTION

Broadly speaking, the invention relates to a linear differential amplifier with improved voltage swing. The linear differential amplifier according to the invention corrects for an error voltage inherent in differential pair amplifiers, without hindering the available voltage swing, and thus, is particularly suited for low-voltage applications.

In a first embodiment, a differential amplifier according to the invention includes: an input differential amplifier for receiving an input voltage difference to be amplified; a distortion correction differential amplifier for producing an error correction amount; and an output differential amplifier for receiving the input voltage difference and the error correction amount, amplifying the input voltage difference to produce an output voltage, and correcting the output voltage in accordance with the error correction amount. Preferably, the distortion correction amplifier operates to determine the error correction amount needed to correct the input differential amplifier, yet the error correction amount is used to correct the output voltage produced by the output differential amplifier.

In a second embodiment, a linear differential amplifier for amplifying a differential input voltage according to the invention includes: first and second transistors arranged as a first pair of transistors, the first and second transistors each having a base, a collector and an emitter, the emitters of the first and second transistors being connected together through a first emitter resistor, the collectors being respectively coupled to a first supply voltage through first and second load elements, the differential input voltage being applied across the bases, and the emitters also being respectively coupled to a second supply voltage through first and second current sources; third and fourth transistors arranged as a second pair of transistors, the third and fourth transistors each having a base, a collector and an emitter, the emitters of the third and fourth transistors being connected together through a second emitter resistor, an error voltage being applied across the bases, and the emitters also being respectively coupled to the second supply voltage through third and fourth current sources; and fifth and sixth transistors arranged as a third pair of transistors, the fifth and sixth transistors each having a base, a collector and an emitter, the emitters of the first and second transistors being connected together through a third emitter resistor, the collectors being respectively coupled to the first supply voltage through third and fourth load elements, the differential input voltage being applied across the bases, the emitters also being respectively coupled to the second supply voltage through fifth and sixth current sources, the collectors of the fifth and sixth transistors also being respectively coupled to the collectors of the fourth and third transistors, and an output voltage being produced across the collectors of the fifth and sixth transistors.

In a third embodiment, a method for improving available voltage swing of a differential amplifier when amplifying an input voltage difference, includes: receiving an input voltage difference; amplifying the input voltage difference to produce an error voltage; converting the error voltage into an error current; amplifying, separate from the amplifying of the input voltage difference, the input voltage difference to produce an output voltage; and correcting the output voltage in accordance with the error current.

Advantages of differential amplifiers according to the invention include improved voltage swing as well as greater suitability to low voltage applications. Other aspects and advantages of the invention will become apparent from the following detailed description, taken in conjunction with the accompanying drawings, illustrating by way of example the principals of the invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

The invention relates to a linear differential amplifier with improved voltage swing. The linear amplifier according to the invention corrects for an error voltage inherent in differential pair amplifiers, without hindering the available voltage swing, and thus, is particularly suited for low-voltage applications.

Embodiments of the invention are discussed below with reference to FIGS. 3–5. However, those skilled in the art will readily appreciate that the detailed description given herein with respect to these figures is for explanatory purposes as the invention extends beyond these limited embodiments.

Figure 1:
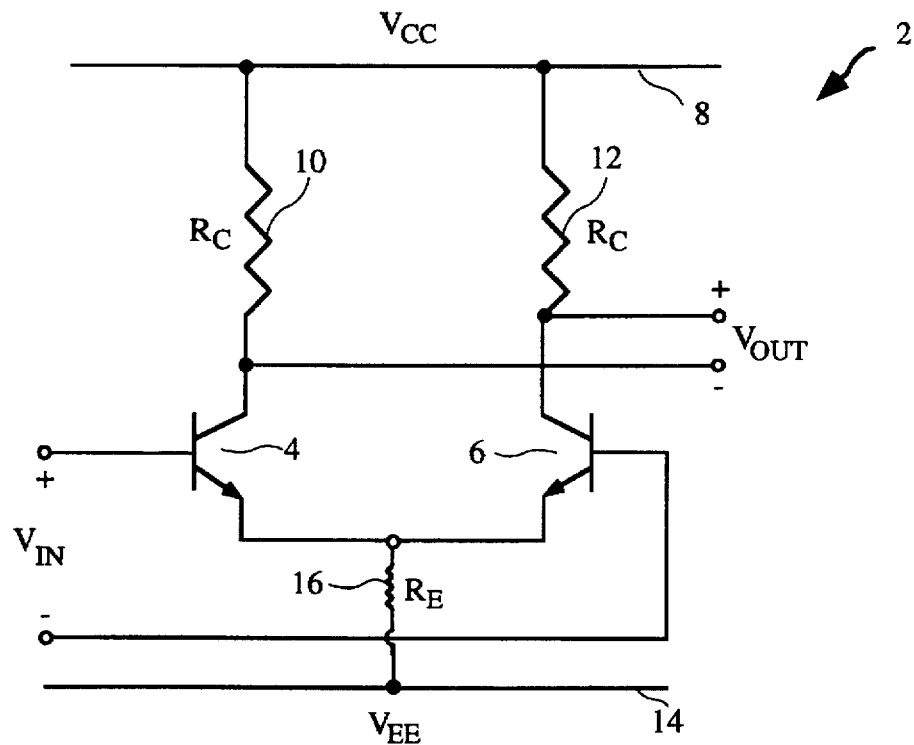
FIG. 1 illustrates a schematic diagram of a conventional differential amplifier.
Figure 2:
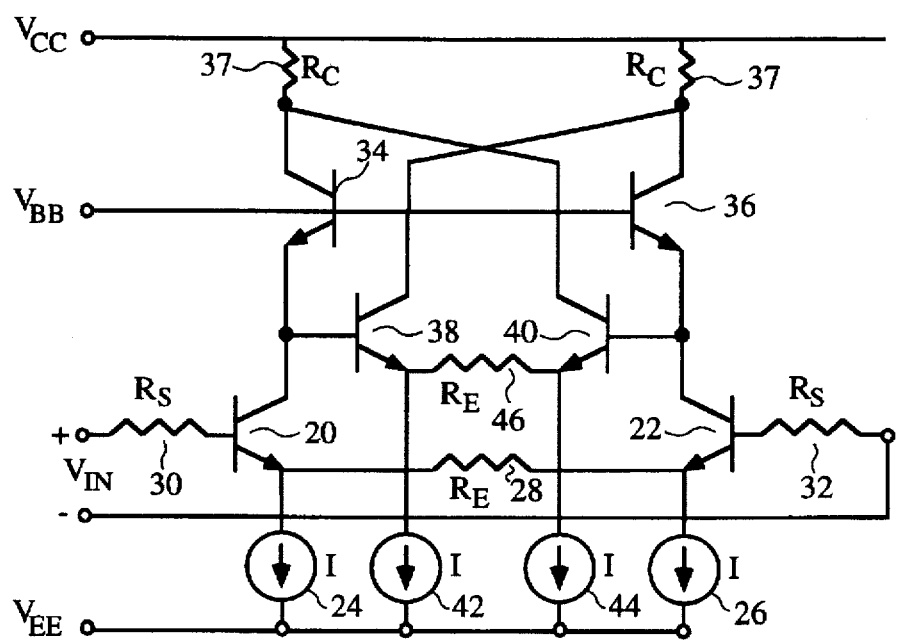
FIG. 2 illustrates a schematic diagram of a conventional cascomp amplifier.
Figure 3:
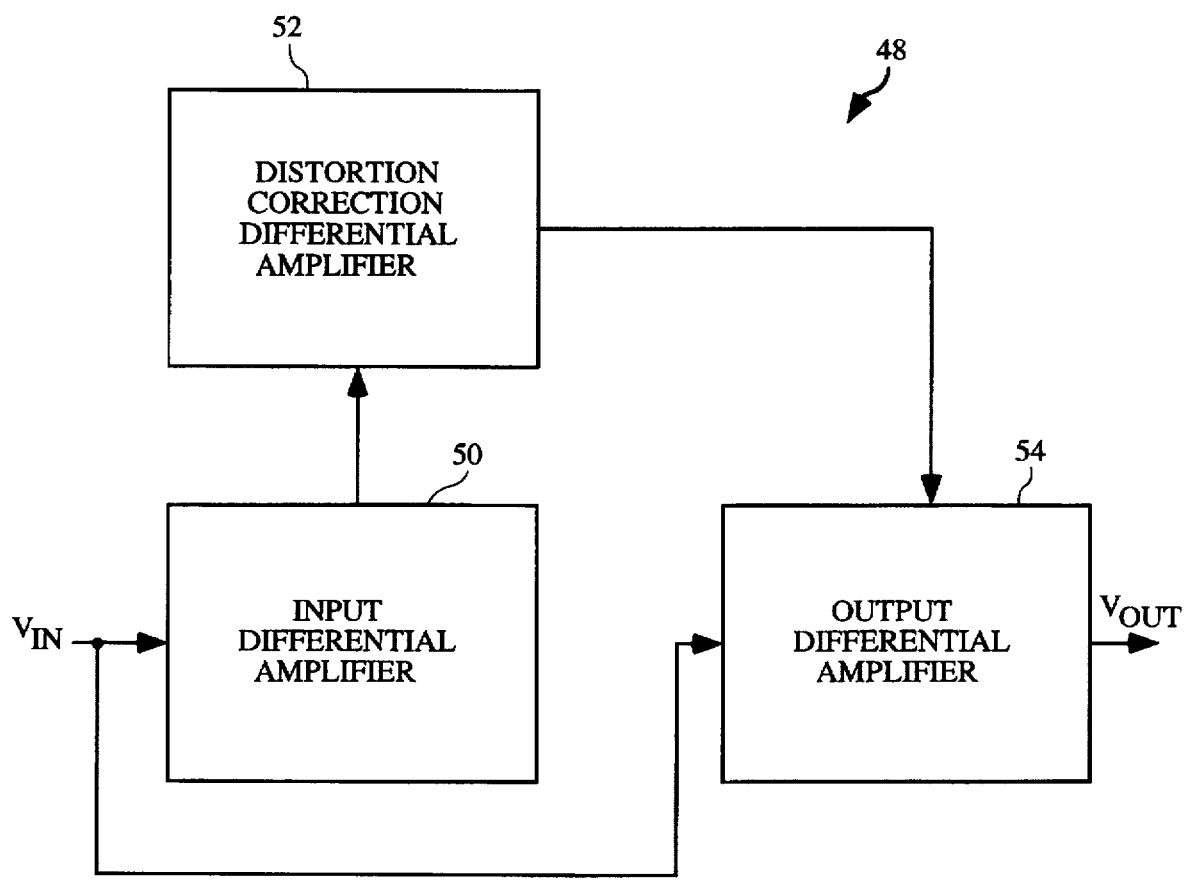
FIG. 3 is a block diagram of a differential pair amplifier according to a basic embodiment of the invention.

FIG. 3 is a block diagram of a differential pair amplifier 48 according to a basic embodiment of the invention. The differential pair amplifier 48 is constructed from several amplifiers. In particular, the differential pair amplifier 48 includes an input differential amplifier 50, a distortion correction differential amplifier 52, and an output differential amplifier 54. Both the input differential amplifier 50 and the output differential amplifier receive a differential input voltage ($V_{IN}$). The distortion correction differential amplifier 52 monitors an error voltage ($\Delta V_{BE}$) associated with the input differential amplifier 50 and produces an error current in accordance therewith. The error current is then forwarded to the output differential amplifier 54. The output differential amplifier 54 amplifies the differential input voltage ($V_{IN}$) to produce an output voltage ($V_{OUT}$). In addition, the output differential amplifier 54 eliminates (cancels out) an error voltage ($\Delta V_{BE}$) associated with the output differential amplifier 54 using the error current received from the distortion correction differential amplifier 52. Consequently, the output voltage ($V_{OUT}$) is free of non-linear distortion otherwise caused by the error voltage ($\Delta V_{BE}$) even in low voltage situations. Actually, the error voltage ($\Delta V_{BE}$) is not completely eliminated, but is eliminated at least to a first order. Hence, as used herein the terms "linear" and "eliminate" when referring to the differential amplifier mean "substantially linear" and "substantially eliminate", such as to a first order, as well understood by those skilled in the art.

Figure 4:
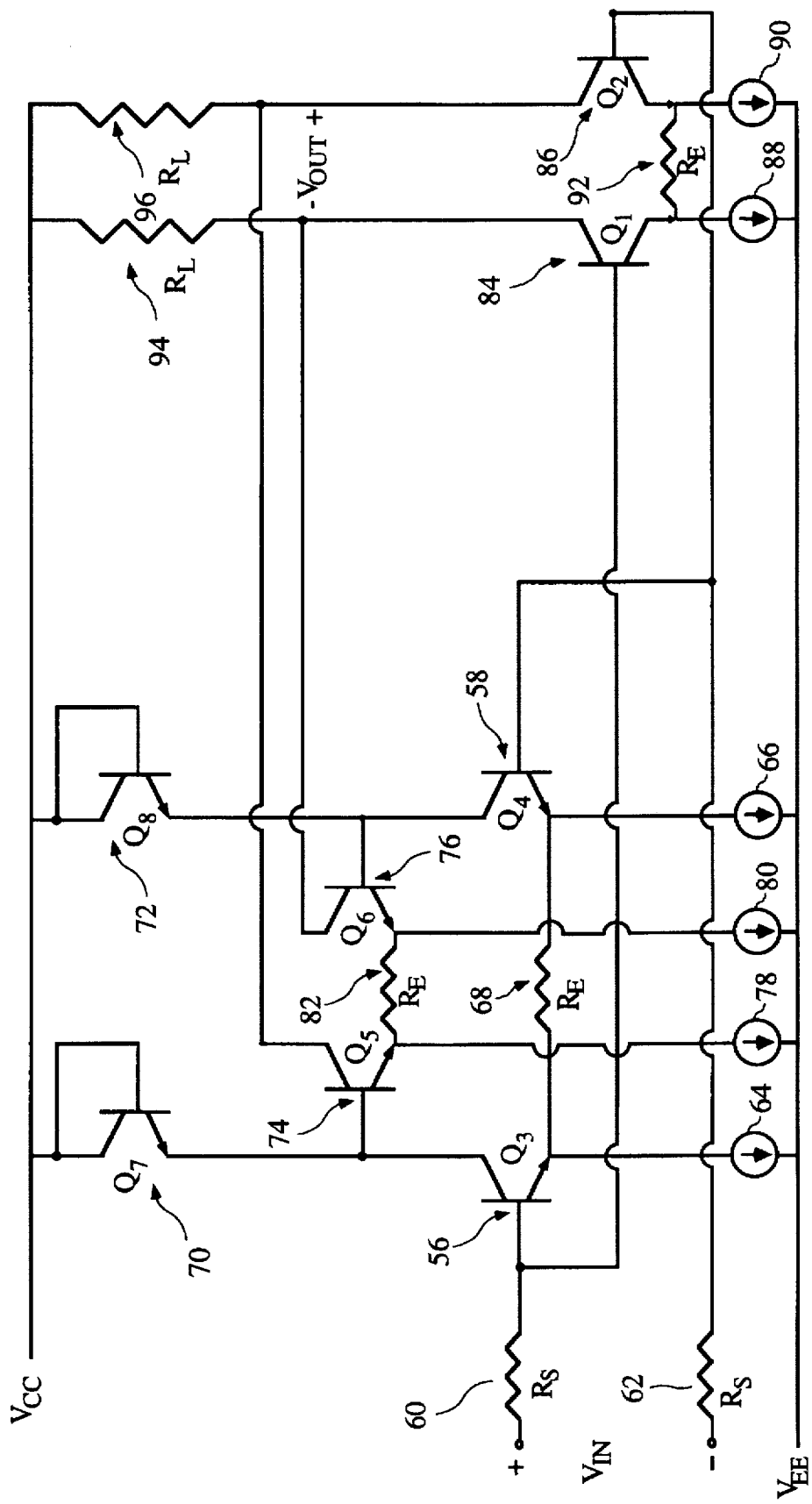
FIG. 4 is a block diagram of a differential pair amplifier according to a first embodiment of the invention.

FIG. 4 is a block diagram of a differential pair amplifier 55 according to a first embodiment of the invention. As with the basic embodiment illustrated in FIG. 3, the differential pair amplifier 55 according to the first embodiment is also constructed from several amplifiers. The construction of the differential pair amplifier 55 includes circuitry corresponding to the input differential amplifier 50, the distortion correction differential amplifier 52, and the output differential amplifier 54.

The differential pair amplifier 55 includes a first pair of amplifying transistors 56 and 58 ($Q_3$ and $Q_4$). The base of the amplifying transistors 56 and 58 ($Q_3$ and $Q_4$) receive a differential input voltage ($V_{IN}$) from a voltage source (not shown) via source resistors 60 and 62 ($R_S$). The source resistors 60 and 62 ($R_S$) represent the resistance associated with the voltage source. The emitters of the amplifying transistors 56 and 58 ($Q_3$ and $Q_4$) are respectively coupled to a potential source ($V_{EE}$) through current sources 64 and 66, respectively. The emitters of the amplifying transistors 56 and 58 ($Q_3$ and $Q_4$) are also coupled together through an emitter resister 68 ($R_E$). The collectors of the amplifying transistors 56 and 58 ($Q_3$ and $Q_4$) are respectively coupled to a potential source ($V_{CC}$) through load diodes 70 and 72 ($Q_7$ and $Q_8$).

The differential pair amplifier 55 also includes a pair of amplifying transistors 74 and 76 ($Q_5$ and $Q_6$). The bases of the amplifying transistors 74 and 76 ($Q_5$ and $Q_6$) are respectively coupled to the collectors of the amplifying transistors 56 and 58 ($Q_3$ and $Q_4$). The emitters of the amplifying transistors 74 and 76 ($Q_5$ and $Q_6$) are coupled to the potential source ($V_{EE}$) through current sources 78 and 80, respectively. In addition, the emitters of the amplifying transistors 74 and 76 ($Q_5$ and $Q_6$) are coupled together through an emitter resistor 82 ($R_E$). The collectors of the amplifying transistors 74 and 76 ($Q_5$ and $Q_6$) couple to circuitry corresponding to the output differential amplifier 54 as will be discussed below.

The differential pair amplifier 55 still further includes a third pair of amplifying transistors 84 and 86 ($Q_1$ and $Q_2$). The emitters of the amplifying transistors 84 and 86 ($Q_1$ and $Q_2$) are coupled to the potential source ($V_{EE}$) through current sources 88 and 90, respectively. In addition, the emitters of the amplifying transistor 84 and 86 ($Q_1$ and $Q_2$) are coupled together through an emitter resistor 92 ($R_E$). The collectors of the amplifying transistors 84 and 86 ($Q_1$ and $Q_2$) couple to the collectors of the amplifying transistors 76 and 74 ($Q_6$ and $Q_5$), respectively. Furthermore, the collectors of the amplifying transistors 84 and 86 ($Q_1$ and $Q_2$) also couple to the potential source ($V_{CC}$) through load resistors 94 and 96 ($R_L$), respectively.

The current in the collectors of the amplifying transistors 84 and 86 ($Q_1$ and $Q_2$) directly drive the load resistors 94 and 96 ($R_L$), while the current in the collectors of the amplifying transistors 56 and 58 ($Q_3$ and $Q_4$) drive the diode loads 70 and 72 ($Q_7$ and $Q_8$). The voltage appearing across the emitters of the diode loads 70 and 72 ($Q_7$ and $Q_8$) is an error voltage ($\Delta V_{BE1}$). The following formula (2) more accurately defines the error voltage ($\Delta V_{BE1}$):

$$\Delta V_{BE1} = V_T \ln(I_{C3}/I_{C4}) \quad (2)$$

where $I_C$ is a collector current and $V_T$=kT/q, with k being the Boltzmann constant, T being temperature (Kelvin) and q being electronic charge magnitude. This error voltage ($\Delta V_{BE1}$) replicates the signal-dependent difference in the base-emitter voltages of the amplifying transistors 56 and 58 ($Q_3$ and $Q_4$) because the base emitter voltage of the diode load 70 ($Q_7$) matches the base emitter voltage of the amplifying transistor 56 ($Q_3$) and because the base emitter voltage of the diode load 72 ($Q_8$) matches the base emitter voltage of the amplifying transistor 58 ($Q_4$). The amplifying transistors 74 and 76 ($Q_5$ and $Q_6$) convert this error voltage ($\Delta V_{BE1}$) into an error current using the emitter resistor 82 ($R_E$). Thereafter, this error current is added to the current flowing through the load resistors 94 and 96 ($R_L$) and thereby operates to correct for the non-linearity in the pair of amplifying transistors 84 and 86 ($Q_1$ and $Q_2$).

In particular, the signal current in the collectors of the amplifying transistors 84 and 86 ($Q_1$ and $Q_2$) is:

$$(V_{IN} - \Delta V_{BE2})/R_E$$

where $\Delta V_{BE2} = V_T \ln(I_{C1}/I_{C2})$ and $R_E$ is the resistance of the emitter resistors.

The error current in the collectors of the amplifying transistors 74 and 76 ($Q_5$ and $Q_6$) is approximately:

$$\Delta V_{BE3}/R_E$$

Therefore, the total signal current in the load resistors 94 and 96 ($R_L$) is:

$$(V_{IN} - \Delta V_{BE2})/R_E + \Delta V_{BE3}/R_E = V_{IN}/R_E$$

The above simplification assumes that $\Delta V_{BE2}$ is approximately equal to $\Delta V_{BE3}$ which is normally reasonable, particularly when the associated transistors are fabricated on the same semiconductor wafer.

Hence, the total signal current through the load resistors 94 and 96 ($R_L$) is a linear output current with respect to $V_{IN}$. Consequently, the output voltage ($V_{OUT}$) is likewise linear.

Comparing FIG. 4 with FIG. 3, the circuitry in FIG. 4 that is associated with the input differential amplifier 50 includes the first pair of amplifying transistors 56 and 58 ($Q_3$ and $Q_4$), the current sources 64 and 66, the emitter resister 68 ($R_E$), and the load diodes 70 and 72 ($Q_7$ and $Q_8$). The circuitry in FIG. 4 that is associated with the distortion correction differential amplifier 52 includes the pair of amplifying transistors 74 and 76 ($Q_5$ and $Q_6$), the current sources 78 and 80, and the emitter resistor 82 ($R_E$). The circuitry in FIG. 4 that is associated with the output differential amplifier 54 includes the third pair of amplifying transistors 84 and 86 ($Q_1$ and $Q_2$), the current sources 88 and 90, and the load resistors 94 and 96 ($R_L$).

Figure 5:
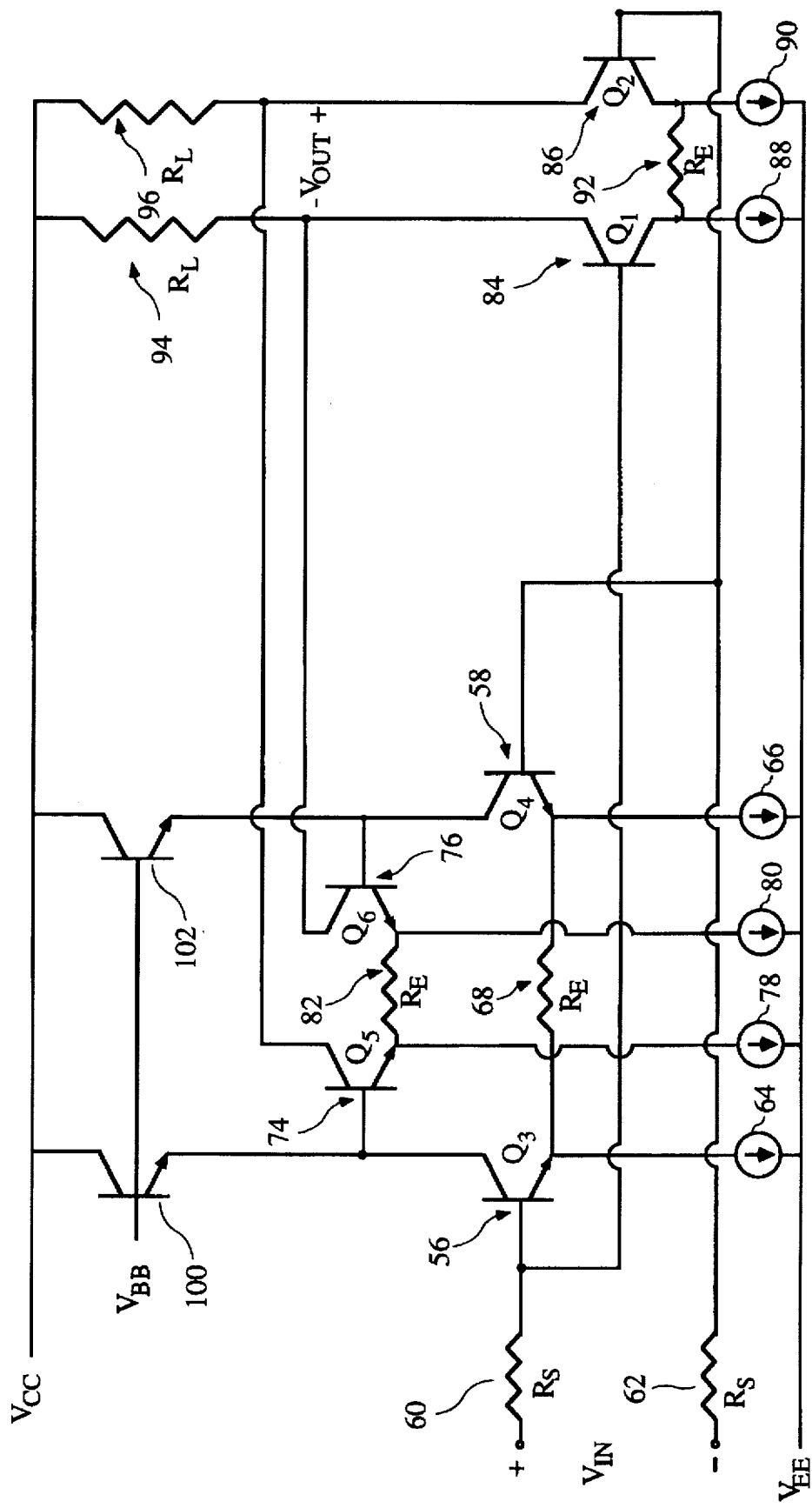
FIG. 5 is a block diagram of a differential pair amplifier according to a second embodiment of the invention.

FIG. 5 is a block diagram of a differential pair amplifier 98 according to a second embodiment of the invention. The differential pair amplifier 98 is largely the same as the differential pair amplifier 55 shown in FIG. 4. The difference is that the load diodes 70 and 72 of FIG. 4 are replaced by load transistors 100 and 102. The load transistors 100 and 102 share a common base coupled to a predetermined supply voltage ($V_{BB}$).

In the first and second embodiments of the invention discussed above, there are preferred aspects to the invention. Preferably, the transistors are all the same, i.e., having the same type and size, except for minor differences resulting from IC processing. The current sources 64, 66, 78, 80, 88 and 90 are also preferably the same, and each of which is preferably constructed from a single transistor. Also, the first through third emitter resistors 68, 82 and 92 (also known as emitter degeneration resistors) may have essentially the same resistance, but it may be preferable to form one or both of the first and second emitter resistors 68 and 82 so as to have a resistance slightly smaller than the resistance of the third emitter resistor 92. The slight difference in resistance causes the error voltage produced to be slightly higher so as to compensate for the fact that the distortion correction differential amplifier 52 itself has errors. Also, such error could also be reduced or compensated by adding another distortion correction amplifier to correct the error voltage (current) produced by the distortion correction differential amplifier 52.

Note also that the error voltage $\Delta V_{BE}$ is small compared to the input voltage. As a result, the amplifying transistors 74 an 76 ($Q_5$ and $Q_6$) operate in a relatively more linear range than do the other two pairs of amplifying transistors $Q_1$, $Q_2$ and $Q_3$, $Q_4$. However, the voltage error ($\Delta V_{BE3}$) generated by the amplifying transistors 74 and 76 ($Q_5$ and $Q_6$) can also be compensated for by slightly reducing the value of one or both of the emitter resistors 68 and 82 ($R_E$), thereby increasing the signal which appears across the bases of the amplifying transistors 74 and 76 ($Q_5$ and $Q_6$). This is effective because the error always decreases the gain of the amplifier; hence, reducing the value of one or both the emitter resistors 68 and 82 ($R_E$) increases the gain and therefore offsets the reduction caused by the error. In addition, depending on the output requirements the bases and the collectors of the diode loads 70 and 72 ($Q_7$ and $Q_8$) may be at a lower potential than the supply potential $V_{CC}$. By lowering the voltage potential applied to the collectors of the diode loads 70 and 72 ($Q_7$ and $Q_8$), the voltage at the bases of the amplifying transistors 74 and 76 ($Q_5$ and $Q_6$) is lowered, which in turn advantageously allows more signal swing at the collectors of the amplifying transistors 74 an 76 ($Q_5$ and $Q_6$). In FIG. 5, the lowering of the predetermined supply voltage ($V_{BB}$) has the same effect.

The many features and advantages of the present invention are apparent from the written description, and thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. An integrated circuit differential amplifier, comprising:
   an input differential amplifier for receiving an input voltage difference to be amplified;
   a distortion correction differential amplifier, operatively connected to said input differential amplifier, for producing an error correction amount; and
   an output differential amplifier, operatively connected to said distortion correction differential amplifier, for receiving the input voltage difference and the error correction amount, amplifying the input voltage difference to produce an output voltage, and correcting the output voltage in accordance with the error correction amount,
   wherein the construction of said input differential amplifier and said output differential amplifier are the same, and
   wherein said distortion correction amplifier operates to determine the error correction amount needed to correct for distortion in said input differential amplifier, yet the error correction amount is used to correct for distortion in the output voltage produced by said output differential amplifier.

2. An integrated circuit differential amplifier as recited in claim 1, wherein said input differential amplifier and said output differential amplifier are formed on an integrated circuit using the same integrated circuit processing.

3. An integrated circuit differential amplifier as recited in claim 2, wherein said input differential amplifier, said distortion correction differential amplifier, and said output differential amplifier are differential pair amplifiers.

4. An integrated circuit differential amplifier as recited in claim 2, wherein said input differential amplifier, said distortion correction differential amplifier, and said output differential amplifier are differential pair amplifiers having emitter degeneration resistors.

5. An integrated circuit differential amplifier as recited in claim 1, wherein the error correction amount is one of a voltage or a current.

6. An integrated circuit differential amplifier, comprising:
   input differential amplifier means for receiving an input voltage difference to be amplified;
   distortion correction differential amplifier means for producing an error correction amount, the error correction amount being associated with an error caused by said input differential amplifier means; and
   output differential amplifier means for receiving the input voltage difference and the error correction amount, amplifying the input voltage difference to produce an output voltage, and correcting the output voltage in accordance with the error correction amount,
   wherein the construction of said input differential amplifier means and said output differential amplifier means are the same, and
   wherein said distortion correction amplifier means operates to determine the error correction amount needed to correct for distortion in said input differential amplifier means, yet the error correction amount is used to correct for distortion in the output voltage produced by said output differential amplifier means.

7. A linear differential amplifier for amplifying a differential input voltage, said differential amplifier comprising:
   first and second transistors arranged as a first pair of transistors, the first and second transistors each having a base, a collector and an emitter, the emitters of the first and second transistors being connected together through a first emitter resistor, the collectors being respectively coupled to a first supply voltage through first and second load elements, the differential input voltage being applied across the bases, and the emitters also being respectively coupled to a second supply voltage through first and second current sources;
   third and fourth transistors arranged as a second pair of transistors, the third and fourth transistors each having a base, a collector and an emitter, the emitters of the third and fourth transistors being connected together through a second emitter resistor, an error voltage being applied across the bases, and the emitters also being respectively coupled to the second supply voltage through third and fourth current sources; and
   fifth and sixth transistors arranged as a third pair of transistors, the fifth and sixth transistors each having a base, a collector and an emitter, the emitters of the first and second transistors being connected together through a third emitter resistor, the collectors being respectively coupled to the first supply voltage through third and fourth load elements, the differential input voltage being applied across the bases, the emitters also being respectively coupled to the second supply voltage through fifth and sixth current sources, the collectors of the fifth and sixth transistors also being respectively coupled to the collectors of the fourth and third transistors, and an output voltage being produced across the collectors of the fifth and sixth transistors,
   wherein the first and second transistors are provided to model the fifth and sixth transistors so as to obtain an estimate of non-linearities induced by the fifth and sixth transistors.

8. A linear differential amplifier as recited in claim 7, wherein the output voltage produced by said linear differential amplifier has an improved swing voltage.

9. A linear differential amplifier as recited in claim 7, wherein the output voltage produced by said differential amplifier has an improved swing voltage making said differential amplifier suitable for low voltage applications.

10. A linear differential amplifier as recited in claim 7, wherein the first through sixth transistors are all the same.

11. A linear differential amplifier as recited in claim 7, wherein the first through third emitter resistors have substantially the same resistance.

12. A linear differential amplifier as recited in claim 7, wherein at least one of the first and second emitter resistors has a resistance slightly smaller than the resistance of the third emitter resistor.

13. A linear differential amplifier as recited in claim 7, wherein the first and second load elements are diodes or transistors, and the third and fourth load elements are resistors.

14. A linear differential amplifier as recited in claim 7, wherein the error voltage is produced by the first and second transistors across the collectors of the first and second transistors and is respectively coupled to the bases of the third and fourth transistors.

* * * * *